United States Patent [19]

Lightbody et al.

[11] Patent Number: 4,528,500
[45] Date of Patent: Jul. 9, 1985

[54] APPARATUS AND METHOD FOR TESTING CIRCUIT BOARDS

[76] Inventors: James D. Lightbody; William S. Lightbody, both of 32600 Fairmount Blvd., Pepper Pike, Ohio 44124

[21] Appl. No.: 559,728

[22] Filed: Dec. 9, 1983

Related U.S. Application Data

[63] Continuation-in-part of Ser. No. 210,539, Nov. 25, 1980, Pat. No. 4,443,756.

[51] Int. Cl.³ .............................................. G01R 15/12
[52] U.S. Cl. ...................... 324/73 PC; 324/158 P; 324/158 F
[58] Field of Search .......... 324/73 R, 73 AT, 73 PC, 324/158 F, 158 P; 200/234, 235

[56] References Cited

U.S. PATENT DOCUMENTS 4,038,599 7/1977 Bove ................................ 324/158 F
4,066,859 1/1978 Steinmetz ............................ 200/235

OTHER PUBLICATIONS

S. E. Wheeler et al., Method to Allow Automatic Probing of File Mounted Logic Cards, IBM Tech. Disc. Bull., vol. 24, No. 6, Nov. 1981, pp. 2740-2741.
L. H. Faure et al., "Reference Location Detector Apparatus", IBM Tech. Disc. Bulletin, vol. 21, No. 3, Aug. 1978, pp. 1019, 1020.

Primary Examiner—Michael J. Tokar

[57] ABSTRACT

This invention relates to an apparatus and method for locating a pin board in respect to a matrix testing jig in a test fixture for printed circuit boards.

27 Claims, 22 Drawing Figures

APPARATUS AND METHOD FOR TESTING CIRCUIT BOARDS

The invention of this application relates to an apparatus and method for testing circuit boards.

This application is a continuation in part of U.S. application Ser. No. 210,539, filed Nov. 25, 1980 for an Apparatus and Method for Testing Printed Circuit Boards, the same inventors, now issued into U.S. Pat. No. 4,443,756.

It is an object of this invention to reduce the cost of the testing apparatus and machine. The testing apparatus of this invention is simple. It is easily made. In addition the testing apparatus of this invention reduces the cost of the testing machine used with it by reducing the demands upon such machine.

It is an object of this invention to reduce the cost to test circuit boards after the purchase of the testing apparatus and machine. There is no hand wiring necessary in the testing apparatus of this invention. No special interchangeable test head is needed. The pin board can be relatively light gauge. It is simple for anyone to set up the testing apparatus of this invention for testing any particular circuit board. The testing apparatus of this invention can be quickly and easily set up to test any board at any time. It increases the efficiency of the testing procedure. By lowering the cost of the apparatus by use of a simple pin board, it is economically possible to test many more designs of circuit boards.

It is an object of this invention to increase the reliability of the testing procedure. All hand wiring has been eliminated. The wired connector has been replaced by a small number of address lines. The testing apparatus is simple and easy to understand. It has few parts that need to be modified to test different circuit boards.

It is an object of this invention to increase the versatility of a single testing apparatus. A single testing apparatus of this invention can test a large number of differing boards. The size or quality of the tested circuit board can be changed at any time. It is not necessary to purchase more interfaces or larger connectors to test circuit boards having many points.

It is an object of this invention to increase the availability and quality of the testing procedure. Due to the reduced costs and simplified apparatus automated testing procedures are now available to more companies than before.

Other objects and advantages and a fuller understanding of this invention may be obtained by an examination of the following specification and claims taken in conjunction with the drawings in which:

This invention relates to an apparatus and method for testing circuit boards.

Presently circuit boards are tested by means of a hand wired testing jig connected through interface boards to a testing machine. This jig is made by drilling a specially made interchangeable test head, the test head having an integral connector, inserting single ended pins into the drilled holes in the test head and then hand hard-wiring each and every pin to the connector that is integral with the test head. The connector is then plugged into the interface of a testing machine. For each and every pin in the test head there must be a discrete hand or machine run wire to the connector and from the connector to the interface of the testing machine—8000 tested points must have 8000 hand run wires.

This is very inefficient and costly.

Our invention utilizes a pin board, double ended pins and a matrix testing jig to test circuited circuit boards. Each pin is connected to the testing machine through that pin's contact with a pad on the matrix testing jig. There is no need for specially made testing heads having integral connectors nor the hand hard wiring of the pins to the connector. 8000 tested points need have no hand run wires. The direct computer matrix address of the pads reduces the need for all but a bare minimum number of address lines.

Figure 1:
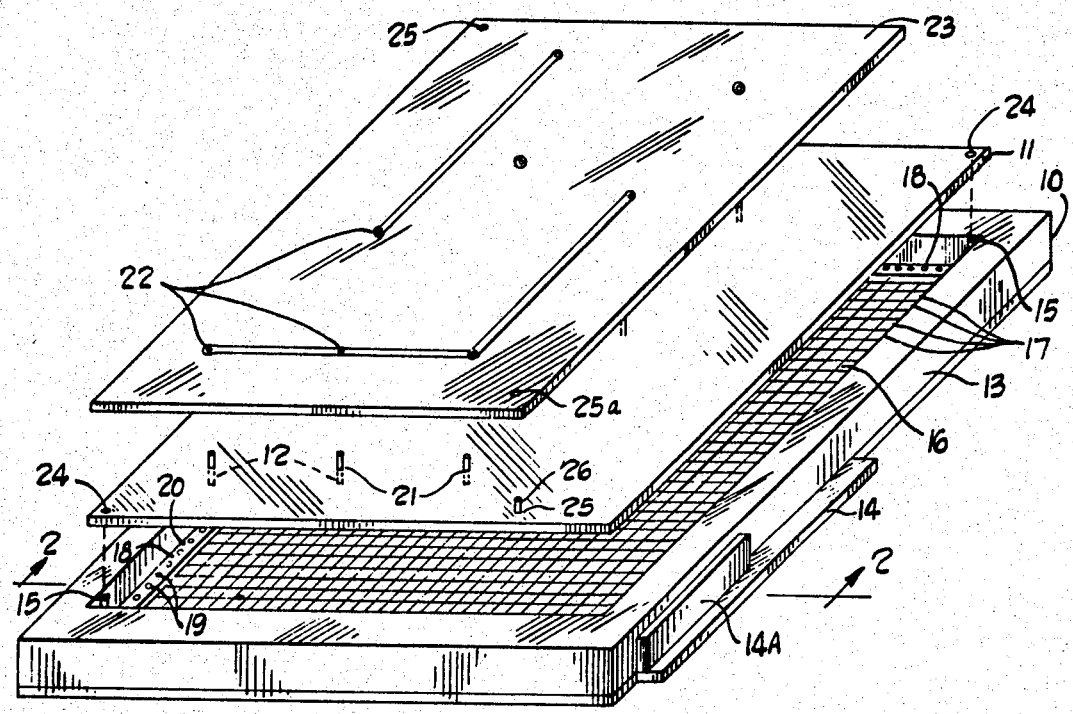
FIG. 1 is an expanded perspective drawing of a testing apparatus constructed in accord with the teachings of this invention.
Figure 2:
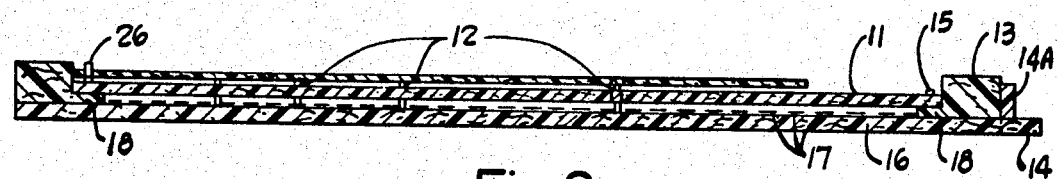
FIG. 2 is a cut away side view of the testing apparatus of FIG. 1 taken along lines 2—2 of that figure.
Figure 3:
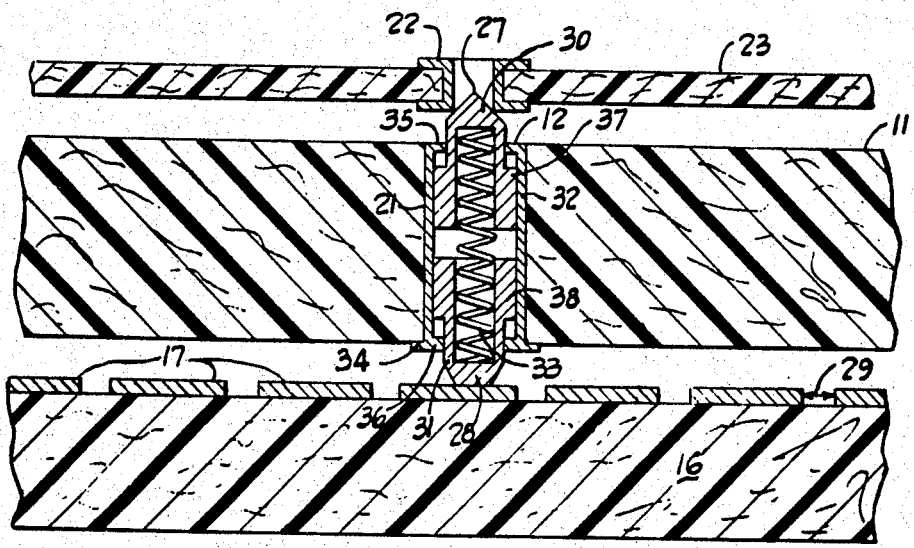
FIG. 3 is an enlarged drawing of the area of the bisected pin in FIG. 2.

The apparatus of our invention includes a matrix testing jig 10, a pin board 11 and double ended pins 12. See FIGS. 1–3.

The matrix testing jig 10 includes a frame 13, a connector 14, pin board locating pins 15 and a matrix substrate 16.

The matrix substrate 16 is formed of a multitude of electrically conductive discrete pads 17. The matrix substrate 16 is universal for testing differing circuit boards. Each pad 17 is electrically insulted from every other pad 17. In the embodiment shown the pads 17 are laid out in rows and columns. Each pad 17 is electrically circuited to the testing machine in such a way that each individual pad 17 can be addressed and/or read by the testing machine. This is accomplished in set circuitry; the circuits are never altered. The matrix substrate 16 may be a circuit board itself. This is the preferred embodiment. The pads 17 are formed upon its surface through conventional etching techniques. Alternately they could be flat head rivets. The circuit board in the preferred embodiment includes the matrix, digital address and read circuitry and the connector 14. 8000 points can be addressed through a line connector 14 having 180 lines, 80×100 non-digitalized matrix, or 30 lines, a completely digitalized matrix having separate address and read lines—8192 points, or two lines go, no-go after all the circuitry of this application. (Depending on the matrix technique and specific circuitry used this number could vary. In any event, it would be small. In an alternate configuration, and for direct connection with most of the existing testing machine each pad 17 could have a discrete circuit leading from that particular pad 17 to the connector 14. The pads 17 themselves would be still be laid out in a matrix form. For 8000 points there would be an 8000 circuit connector 14.

The size of the matrix substrate 16 and of the pads 17 can be varied as the needs of the customer dictate. For example, an 8½"×11" matrix substrate 16 containing 80×100 pads 17 (roughly 1/10"×1/10" pads 17) would form a testing apparatus to test most circuit boards sizes and do so with a 99%+ accuracy. Note that it is all right for pins 12 to contact more than one pad 17 as long as the pins 12 continue to contact the same pads 17; Any errors induced by this configuration would occur mostly due to any chance spacing of two non-circuitry connected pins 12 less than 1/10" apart, and few circuit boards have more than very small numbers of pads with such spacing.

If a larger size board is to be tested by, or more accuracy is needed of, a given testing apparatus such aims can be easily satisfied; the matrix substrate 16 can be made any size—the pads 17 can be made exceedingly small. For example a matrix substrate 16 could be made 36"×36" with 3600×3600 pads 17 (roughly 1/100" spacing) or 36×36 pads 17 (roughly 1" spacing). Please note that with the matrix circuitry and the digitalized address lines every pad 17 on the oversize (36"×36") small pad (3600×3600 pad 17) matrix substrate 16 could be separately addressed and read through a forty-six line connector 14. (Again depending on the matrix technique specific matrix circuitry used it could be greater or less. In any event it would be a small number.)

A frame 13 surrounds the matrix substrate 16, whatever its size. In the embodiment shown the matrix substrate 16 is glued to the underside of the frame 13 with the connector 14 protruding out of a notch in the side of the frame 13. The frame rigidly holds the matrix substrate 16.

The frame 13 also holds the pin board 11 in position in respect to the matrix substrate 16.

It is important that the pin board 11 not move in respect to the matrix substrate 16; any motion could alter the orientation of the pins 12 in respect to the pads 17 and induce the testing machine to signify that good circuit boards had shorts or opens not actually present on such circuit boards.

Small lips 18 serve to hold the pin board 11 vertically spaced in respect to the matrix substrate. (The pins 12 also help in this regard.)

Locating pins 15 in combination with a tight fit of the pin board 11 in respect to the frame 13 prevent any horizontal movement of the pin board 11.

Alternately or additionally horizontal support can be provided by adding vacuum holding holes 19 in the lips 18 of the frame 13 and/or elsewhere. When a pin board 11 is placed in position in respect of the matrix substrate 16 the vacuum holding holes 19 wouldbe energized to draw the pin board 11 tightly down against the frame 13 and thus secure it against any motion in respect of the matrix substrate 16. Anti-skid material 20 would further facilitate this vacuum holding.

The frame 13 is preferably constructed of a dimensionally stable electrically non-conductive material.

The pin board 11 is a blank electrically non-conductive board. It is sized to be securely held by the frame 13 (Whether by fastening pins 15, the inside dimensions of the frame walls, a vacuum hold and/or whatever). The pin board 11 should be thick enough to insure a solid uniform support of the pins 12 during the full length of testing; any error introduced by a flexing of the pin board 11 or motion of the pins 12 in respect to the pin board 11 may induce the testing machine to indicate opens or shorts in what is really a good circuit board. As the number of circuit boards to be tested by a single pin board 11 and the size of the pin board 11 increases and the size of the pads 17 on the matrix substrate 16 decreases the pin boards' 11 thickness may need to be increased.

Please note the pin boards' 11 main function is to retain the pins 12 in place in respect to lateral and wobbling movements, not against every up and down movement; the pins 12 in the embodiment disclosed pass all up and down forces directly to the matrix substrate 16.

The pin board 11 has a pattern of holes 21 in it. These holes 21 are laid out to match the pattern of points 22 on the circuit board 23 that is to be tested by the testing apparatus.

In practice, these holes 21 in the pin board 11 are made by drilling the pin board 11 with the drilling coordinates of the points 22 on circuit board 23 to be tested. This is easily accomplished by the drilling of such pin board 11 with the drilling program of the circuit board 23 to be tested. It is preferred that a single sized drill is used for this operation so as to facilitate later pinning operations and to foreclose the possibility of pin-mismatch wobbling.

The pin board 11 also has a pair of locating holes 24 and orientation holes 25 in it. The locating holes 24 are used with locating pins 15 in restraining movement of the pin board 11. Orientation pins 26 are inserted into the second set of holes 25. These orientation pins 26 are located in reference to the pattern of holes 21 on the pin board 11 to equal the location of the orientation holes 25a in reference to the pattern of points 22 on the circuit board 23 being tested with that particular pin board 11. When the circuit board 23 being tested is placed upon the matrix testing apparatus the combination of the orientation pins 26 on the pin board 11 and orientation holes 25a present on the circuit board 23 being tested fixes the pattern of points 22 on the circuit board 23 exactly above the pattern of holes 21 on the pin board 11. The orientation pins 26 and orientation holes 25a together form the means for locating the circuit board 23 being tested in respect to the pin board.

Most circuit boards currently being produced use production orientation holes to locate circuit boards during manufacturing operations. These production orientation holes could, and ideally would, also be used during the testing procedures as orientation holes 25a. The pin board 11 would be drilled accordingly. Alternately new holes could be drilled or blocks or other locating means could be used to locate the circuit board.

In the embodiment disclosed the pin board 11 is a double thickness insulating board (¼"). A bare circuit board could also be used as a pin board 11 providing that the sides of the pins 12 are electrically insulated from any electrically conductive circuit lines present on such circuit board and that proper attention is paid to the diameter of the pins 12 in relation to the holes they are to be inserted into; a bare circuit board will have active lines and possibly also differing sized holes.

Double ended longitudinally extendable electrically conductive pins 12 are in the holes 21 in the pin board 11. The pins should fit tightly with neither lateral movement nor wobbling.

The top end 27 of the pins 12 should be shaped to insure a good contact with the point 22 on circuit board 23 to be tested.

The bottom end 28 of the pins 12 should be shaped so as to insure contact with a pad 17 on the matrix substrate 16. The bottom end 28 of the pins should ordinarily have a contact diameter a little larger than the spaces 29 between the pads 17 of the matrix substrate 16. This would insure that in no event would contact with a pad not be present. There is no harm in a bottom end 28 of a pin contacting more than one pad 17 at a time as long as the same combination of pads 17 are always contacted during subsequent programming and testing operations.

In the embodiment shown the pins 12 are double ended collared spring loaded pins 12. Each pin 12 has a top portion 30, a bottom portion 31, a collar 32 and a spring 33.

The collar 32 has a shoulder 34 and two inwardly extending lips 35, 36.

The shoulders 34 of the collar 32 contact the bottom surface of the pin board 11 to insure a uniform insertion depth of the pins 12 and to prevent loss of the pins 12 during insertion, usage and storage.

The top inwardly extending lip 35 of the collar 32 cooperates with an outwardly extending shoulder 37 on the bottom of the top portion 30 to retain the top portion 30 in position in respect to the collar 32.

Since in the embodiment shown the testing apparatus is testing bare circuit boards 23, and the point of testing is a holed circuit pad, the top end 27 of the pin 12 is pointed. For testing circuit boards assembled with electronic components a flat or other tip may be desired to insure a good contact.

The bottom inwardly extending lip 36 of the collar 32 cooperates with an outwardly extending shoulder 38 on the top of the bottom portion 31 to retain the bottom portion in respect to the collar 32. In the embodiment shown the bottom end 28 of the bottom portion 31 is flat with a diameter 1.5 times the space between the pads.

The top portion 30 and bottom portion 31 are electrically conductive. The collar 32 need not be.

A spring 33 acts between the top portion 30 and the bottom portion 31. The spring 33 serves to insure good contact of those portions with the circuit board to be tested 23 and the pad 17 of the matrix substrate respectively and to transfer electricity between the top portion 30 and bottom portion 31. The spring also passes through the pin board 11 the downward pressure exerted on the circuit board to be tested 23.

Orientation pins 26 are inserted into holes 25 and locked in position.

When all of the holes 25 have been pinned and orientation pins 26 inserted into holes 25, the pin board 11 is attached to the matrix testing jig 10. The pattern and number, the density, of the pins 26 is generally different than the density of the pads 17.

It is important that the pin board 11 not move in respect to the matrix substrate 16; any motion could induce the testing machine to find shorts or opens in a good board for reason of movement of the pins 12 in respect to the matrix substrate 16.

In the embodiment shown the pin board 11 is held in place in respect to the matrix substrate 16 by the holes 24 fitting over the locating pins 15, by the inside edges of the frame 13, by the lip 18 of the frame 13 and by a vacuum applied to holes 19 through the lip 18 of the frame 13.

Once a pin board 11 corresponding to a certain particular circuit board 23 to be tested has been pinned and affixed to the matrix testing jig 10 the testing apparatus is complete; it needs only to be interconnected to a testing machine, and for circuit boards 23 to be located on it for testing of that particular circuit board to commence.

Ideally the bottom ends 28 of all of the pins 12 contact the pads 17 and not the gaps 29, that is do not bridge too many of the gaps 29 between the pads 17. To insure that this will occur, the matrix testing jig 10 can be fitted with a means of adjusting the alignment between the pins 12 in a given pin board 11 and the pads 17 on the matrix substrate 16. See FIGS. 11-13. With this adjustment feature the pin board 11 is moved in respect to the matrix substrate 16 (or visa versa depending on which is held in fixed position) to align the pins 12 with as many of the pads 17 and as few gaps 29 as possible.

Two alignment fixtures are disclosed. The first, FIGS. 11 and 12, adjusts the alignment between the pins 12 and the pads 17 in X and Y co-ordinates. The second, FIG. 13, adjusts the alignment between the pins 12 and the pads 17 in X,Y and Z (polar) co-ordinates. Other alignment co-ordinates can be substituted as desired.

Figure 11:
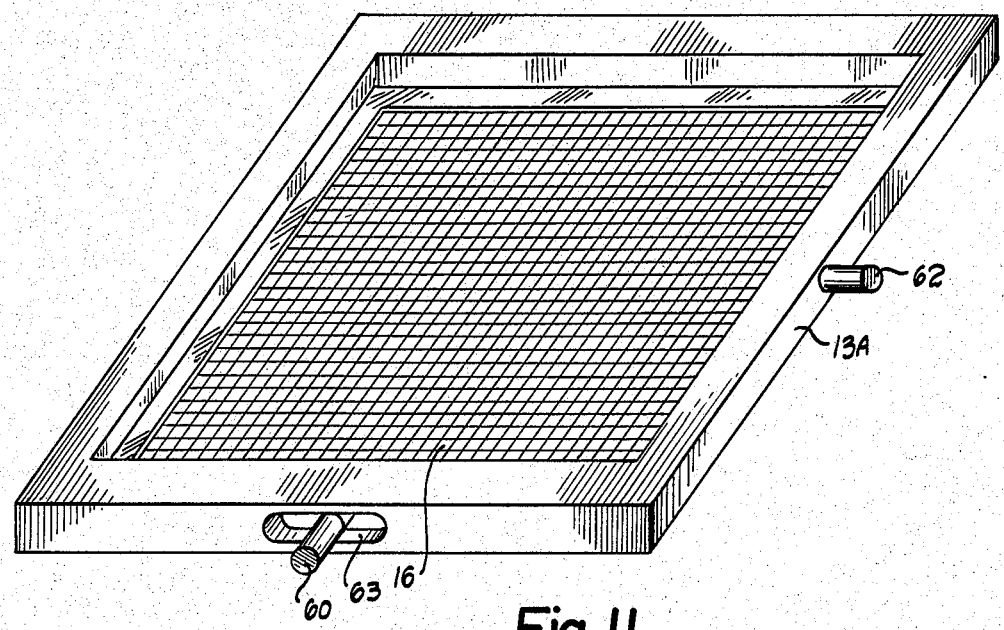
FIG. 11 is perspective drawing of a universal testing jig with an adjustable alignment feature.
Figure 12:
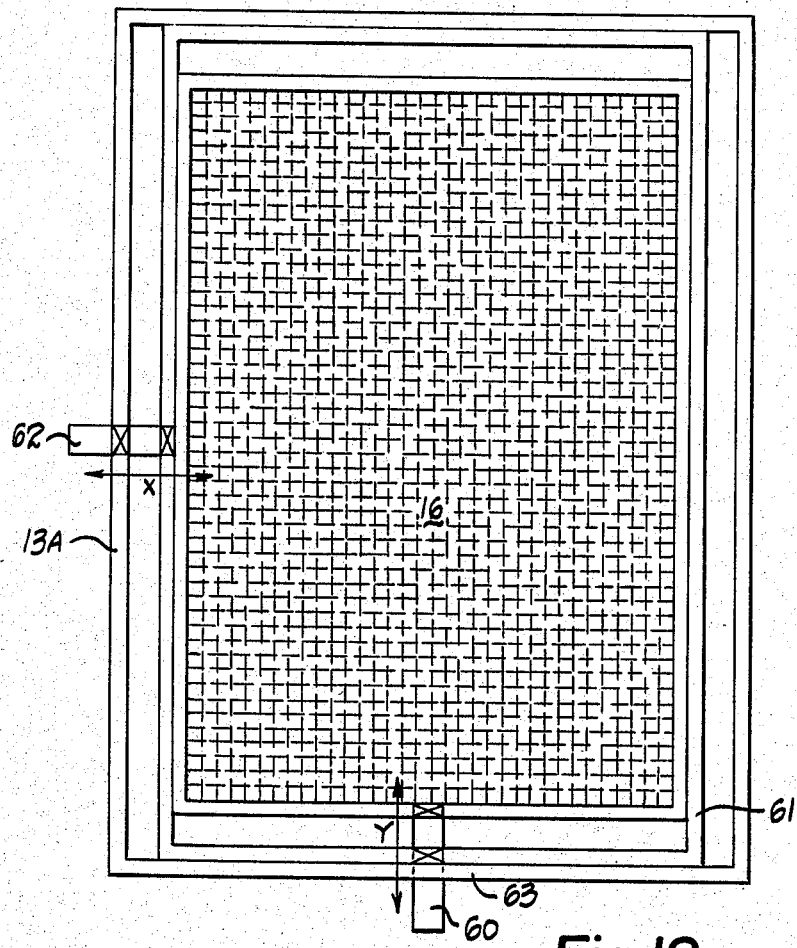
FIG. 12 is a bottom view of the adjustable alignment universal testing jig of FIG. 11.

The first alignment fixture, FIGS. 11 and 12, uses one vernier adjustment screw 60 to adjust the position between a slide carrier member 61 and the matrix substrate 16. This accomplishes a Y axis adjustment. A second vernier adjustment screw 62 is used to adjust the position between the slide carrier member 61 and to the frame 13A. This accomplishes an X axis adjustment. A hole 63 in the frame 13A allows the adjustment screw 60 to move along with the slide carrier 61. The matrix substrate 16 and the pin board 11 would move in respect to each other in response to the adjustment of screws 61 and 62. The adjustment screws 61 and 62 could therefor be used to optimally align a given pin board and a given set of pins 12 with the pads 17 of the matrix substrate.

Figure 13:
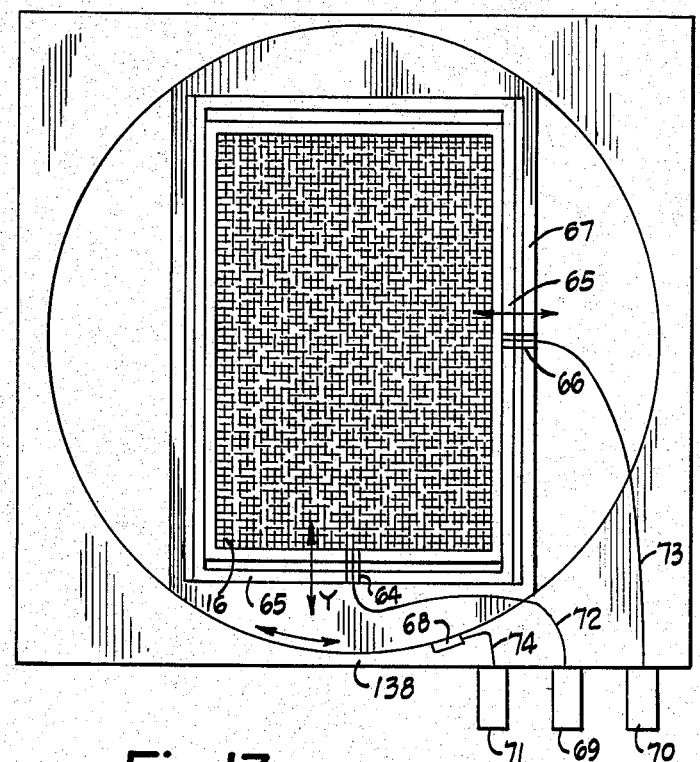
FIG. 13 is a bottom view of an alternate adjustable alignment testing jig.

The second alignment fixture, FIG. 13, like the first uses one vernier adjustment screw 64 to adjust the position between a slide carrier member 65 and the matrix substrate 16 (Y axis). This second fixture uses another vernier adjustment screw 66 to adjust the position between the slide carrier member 65 and an interim member 67 (X axis). A third vernier adjustment screw 68 is used to adjust the polar position between the interim member 67 and the frame 13B (Z axis). The actual control of the adjustment screws 64, 66 and 68 is accomplished by three remote knobs 69, 70 and 71 respectively. The location of these knobs 69, 70 and 71 speed the adjustment process. Wires 72, 73 and 74 connect the knobs (69, 70 and 71) to their associated adjustment screws (64, 66 and 68). As with the first alignment fixture these screws 64, 66 and 68 are used to optimally align a given set of pins 12 with the pads 17 of the matrix substrate.

Both of these fixtures make adjustments between the frame 13 and the matrix substrate 16. To accomplish these adjustments either the frame 13, the matrix substrate 16 or both can be moved in one or all axis of adjustment as desired; the relationship is important, not the actual movement used to provide the relationship.

The actual coordinates used in the adjustable alignment fixtures can be selected in place, through the use of an alignment template or by use of a computer program.

To select the optimal coordinates in place, the adjustment screws are set in their median positions and the appropriate pin board 11 located in testing position in respect to the adjustable alignment test fixture. The Pin Board 11 is then itself tested by the processing circuitry 45 (later discussed). No circuit board 23 is in place during this test. Any place where the bottom 28 of a pin 12 bridges the gap 29 between pads 17 would be read out by the processing circuitry 45 as a short between the pads 17. If the number of these shorts is unacceptable the operator would manipulate the adjustable test fixture to minimize the shorts in a manual optimization procedure. The actual testing of the circuit boards 23 would then begin.

Figure 14:
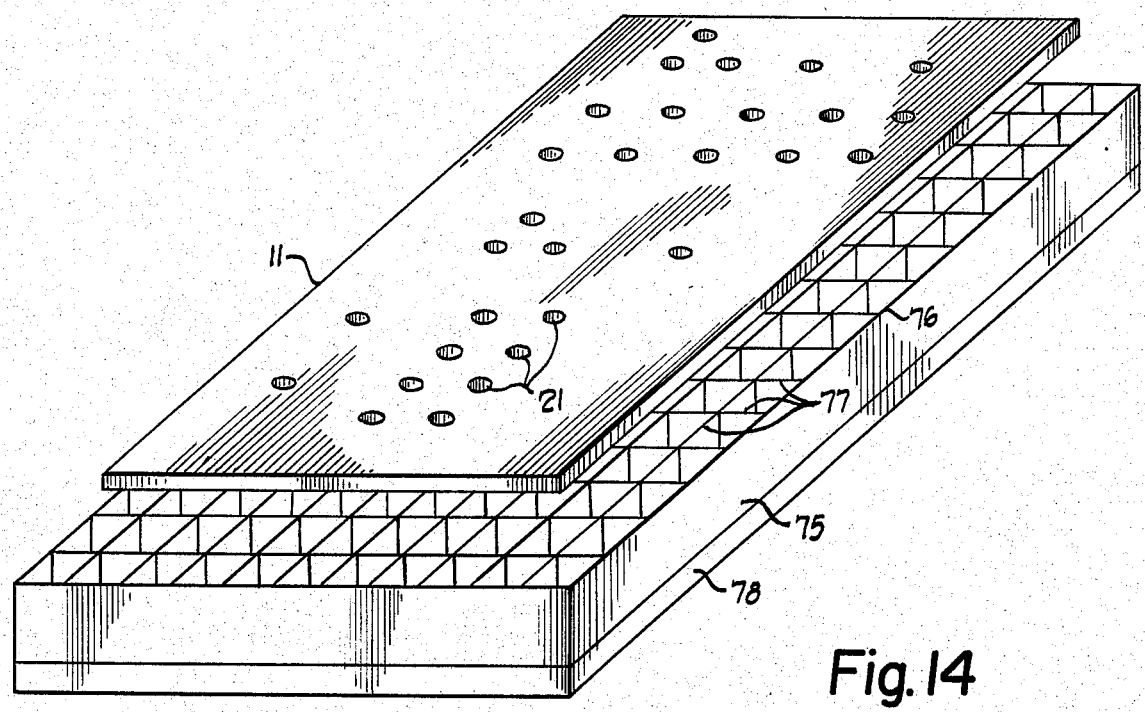
FIG. 14 is an enlarged expanded perspective drawing of an alignment decision making apparatus.
Figure 15:
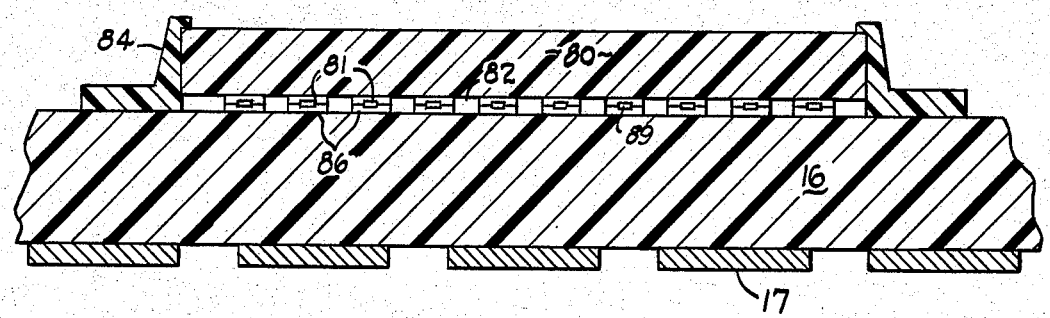
FIG. 15 is an enlarged cutaway side view of a new circuit connection means.
Figure 16:
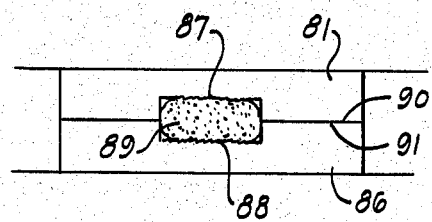
FIG. 16 is an enlarged cutaway side view of a pair of pads of FIG. 15.
Figure 17:
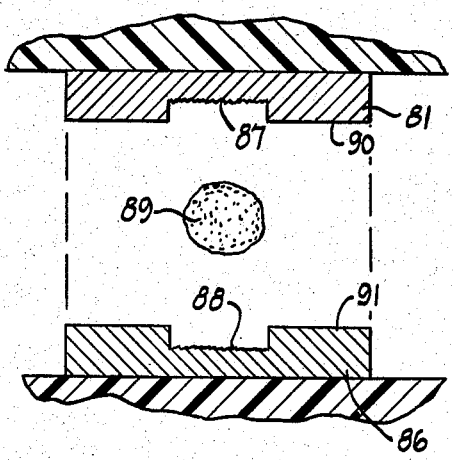
FIG. 17 is an expanded side view of the pair of pads of FIG. 16.
Figure 18:
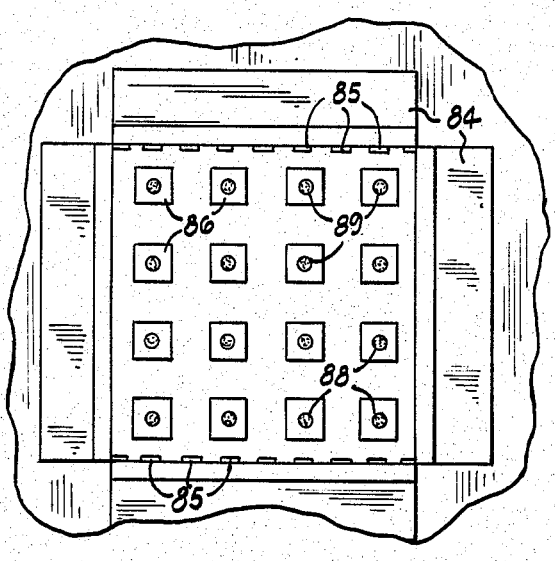
FIG. 18 is an enlarged top view of a circuit board pad and circuit retention means like FIG. 15.
Figure 19:
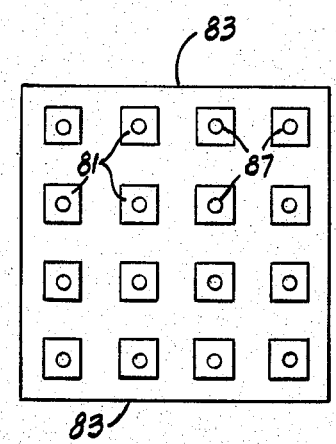
FIG. 19 is an enlarged bottom view of circuit pads like FIG. 15.

To select the optimal co-ordinates through the use of an alignment template, the appropriate pin board 11 is placed on top of a template 75—see FIG. 14. This template 75 has a grid 76 replicating the pattern of the gaps 29 between the pads 17. The grid walls 77 are light conductive. The areas between the grid walls 77 have substantially the same dimensions and relative locations as the pads 17. Template 75 is located on top of a light source 78. The pin board 11 is then manually moved about to minimize the light coming through holes 21 in the pin board 11. As the grid walls 77 allow light passage, this minimization of light would also optimize the coincidence between the holes 21 and the dark areas between the grid walls 77 (and thus also the pads 17 of the similarly laid out matrix substrate 16). Upon minimization of light the pin board 11 is pinned and the relationship between the pin board 11 and the adjustment template 75 is replicated on the adjustable alignment fixture. Since the dark areas of the grid 75 correlate to the pads 17 on the matrix substrate 16 the alignment between the pins 12 on the pin board 11 and the pads 17 on the matrix substrate is optimized. To ease the replication procedure the pin board 11 can (and preferably would) be located in a direct readout fixture (similar to the fixture of FIGS. 11-13 with position readouts instead of adjustment screws). The position readouts would then merely be dialed in on the adjustment screws of the adjustable test fixture to replicate the optimal location of the pin board 11 in respect to the matrix substrate.

To select the optimal co-ordinates through the use of a computer the co-ordinates of the holes 21 of the pin board 11 are fed into a computer, preferably through the use of the already mentioned drilling program for the circuit board 23. The co-ordinates of the pads 17 and gaps 29 on the matrix substrate 16 are also fed into the computer. Within the confines of the available adjustments the computer then operates to optimize the co-incidence of the co-ordinates of the holes 21 with the co-ordinates of the pads 17 (while preferably minimizing the co-incidence of the holes 21 with the gaps 29). The computer then outputs the settings for the adjustment screws that accomplish this optimalization.

The matrix testing apparatus can be with or without this adjustable alignment feature.

To test a circuit board that circuit board is placed onto the testing apparatus. The circuit boards 23 are located on the testing apparatus by their orientation holes 25a snugly fitting over the orientation pins 26 of the pin board 11: the pattern of points 22 on the circuit board 23 being tested are in contact with the pattern of pinned holes 21 on the pin board 11. Each tested point 22 on the circuit board 23 is contacted by the top portion 30 of a pin 12 on the pin board 11. The bottom portion 31 of every one of the pins 12 is in contact with at least one pad 17. Since all of the pads 17 have lines leading to the testing machine thse contacts will be part of the circuit that each point has leading to the testing machine.

The test machine will address and read every tested point over these circuits.

In an alternate configuration the matrix substrate 16 could be constructed out of flexible materials to reduce the number of parts necessary for the testing apparatus to test circuit boards 23. See FIGS. 4 and 5.

Figure 4:
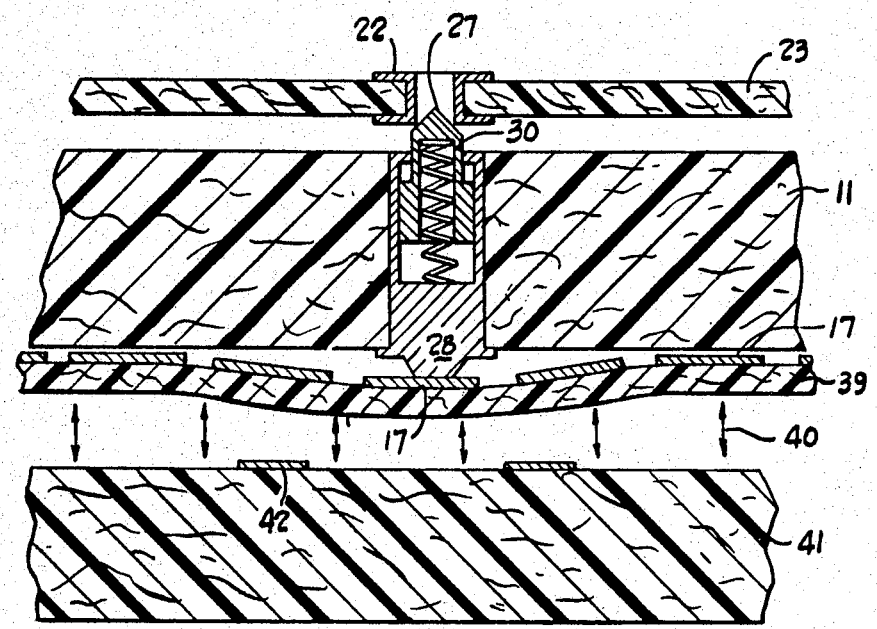
FIGS. 4,5 are enlarged cutaway side views of alternate matrix apparatii.

In the first flexible matrix substrate embodiment, FIG. 4, the flexibility of the flexible matrix substrate 39 in combination with an upward force 40 replaces the spring loaded bottom portion 31 of the pins 12. The matrix 39 directly contacts the bottom ends 28 of the pins 12. An upward force in combination with the flexibility of the substrate 39 replaces the spring loading of the bottom ends 28. The upward force 40 is provided by a spongy material (not shown) or by air pressure between the flexible matrix substrate 39 and a fixed subplate 41. The air pressure is generated by an air pump (not shown) and is selectively applied through holes 42 in the fixed subplate 41. The shape of the bottom ends 28 of the pins 12 remain the same as in the fixed matrix substrate 16 version.

Figure 5:
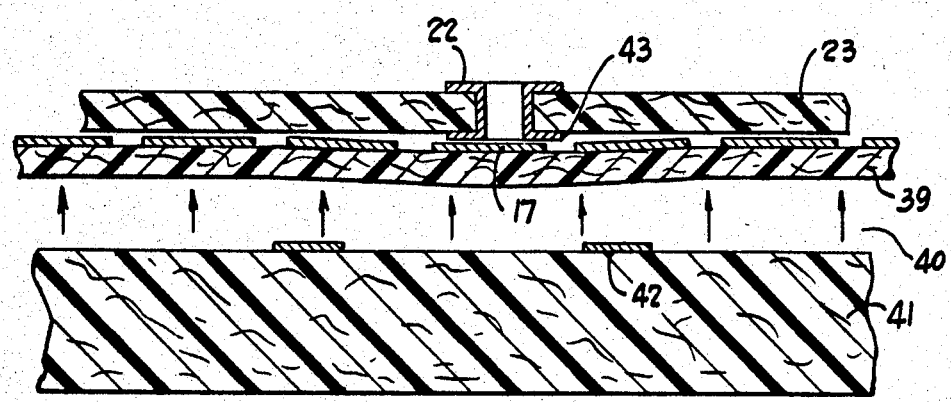

In the second flexible substrate embodiment, FIG. 5, the flexibility of the flexible matrix substrate 39 in combination with an upward force 40 replaces the pins 12 and the pin board 11. The flexible matrix 39 directly contacts the points 22 on the circuit board 23 being tested. If the circuit board 23 being tested has insulated lines 43 (or if an equivalent insulating mask (not shown) is inserted between the flexible matrix substrate 39 and the circuit board 23 being tested)) only the points 22 on the circuit board 23 will be contacted by the pads 17 of the flexible matrix substrate 39. If the circuit board 23 being tested does not have insulated lines 43 (or an equivalent insulating mask) the entire circuit on the circuit board 23 being tested will be contacted - both lines and points 22. If both lines and points 22 are being contacted, the electrical circuitry later described can be programmed to ignore the coordinates of the lines and address and read only the points 22. The upward force 40 is provided by again a spongy material or pressure between the flexible matrix substrate 39 and a fixed sub-plate.

A circuit board having more points 22 than the testing machine can be tested by our invention, albeit with a slightly decreased accuracy, by using pads 17 larger than ideal and accepting the concomitent increased likelihood of some of the closely spaced points 22 on the circuit board being tested 23 being connected through the pins 12 and the pads 17. Any shorts or opens between some of such closely spaced points 22 would not be ascertainable due to the pad 17 interconnections between such points 22 in this lesser pad testing apparatus.

For example, if a circuit board being tested 23 has 16,000 points 22 and one wants to use a testing machine having the capability of testing 8000 points, an 8000 pad 17 matrix substrate 16 could be used to test the 16,000 point 22 circuit board 23. Any cross-circuiting of some closely spaced points 22 through the pins 12 and the pads 17 would be accepted as a cost of the procedure. Flaws between such closely spaced points 22 would not be discovered. Otherwise the circuit board 23 would be tested with an acceptable degree of accuracy.

Similarly a matrix substrate 16 having more pads 17 than the point testing capabilities of a testing machine can be used with such limited testing machine by programming the testing machine to scan only the active pads present on such substrate.

For example, if the matrix substrate 16 being used has 16,000 pads and in consideration of the fact that the circuit boards 23 being tested in this example ordinarily would have only 5,000 active points 22 one wants to use a testing machine having the capability of testing 8,000 points with this 16,000 pad matrix substrate, one could circuit only the active 5,000 points to the 8,000 point testing machine; only the active 5,000 coordinates would be scanned not the entire 16,000 pads 17.

This would best be accomplished by programming the central cpu of the preferred circuitry disclosed hereafter to automatically electrically connect the active coordinates to the testing machine, i.e. to function as a wire from each active pad to the testing machine disregarding all inactive pads. Manual connection or programming, though possible, would be difficult and time consuming.

Since the cost of most existing testing machines are directly related to the number of points being tested by such machines, these reductions in pad number, whether physical or equivalent, would dramatically reduce the cost of such machines; no longer does a manufacturer have to purchase a testing machine capable of testing his most challenging board point for point or in the future of testing the most demanding substrate 16. A machine capable of testing a lesser number of points or pads could be used with accuracy.

This has the result of increasing the practical and economic viability of testing circuit boards over that previously available to a manufacturer.

In either the fixed or flexible matrix substrate configurations the pads 17 are electrically addressed and read by the testing machine. This is accomplished in set circuitry; only the programming of the testing machine and/or pin board 12 are altered in testing differing circuit boards 23, the circuits are not.

In either the fixed or flexible matrix substrate configurations the pads 17 are electrically addressed and read. This is accomplished normally in one of three ways—direct connection (FIG. 6), digital coded (FIG. 7) or matrix (FIG. 8).

Figure 6:
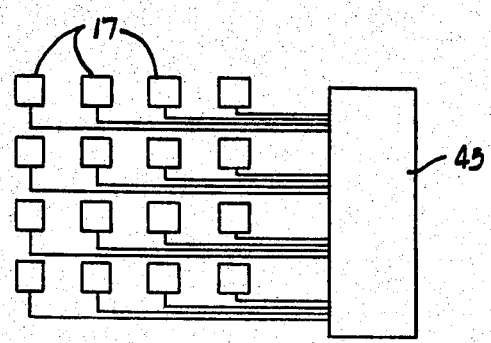
FIGS. 6,7 and 8 are simplified block diagrams of an electric circuit that is connected to the testing apparatus of FIG. 1.

In the direct connection circuitry, FIG. 6, each individual pad 17 on the matrix substrate 16 has an individual wire running from that pad 17 to the central processing circuitry 45. An 8000 pad 17 matrix substrate 16 would have 8000 wires between it and the central processing circuitry 45. The central processing circuitry 45 would directly address and read any point 22 along these wires.

In the direct connection circuitry embodiment the individual wires are preferably etched lines on the printed circuit of matrix substrate 16 leading to a connector on the edge of the printed circuit board.

Figure 7:
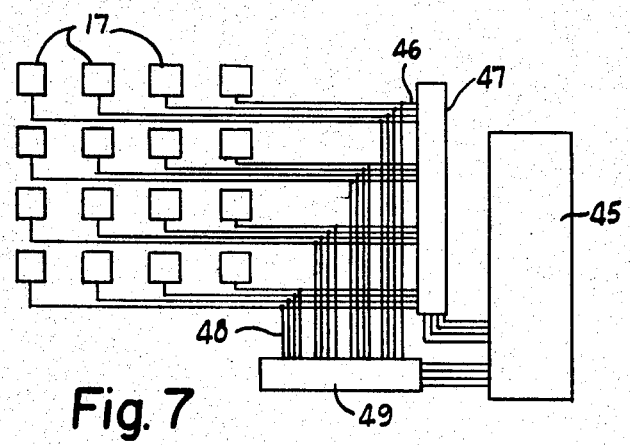
Figure 8:
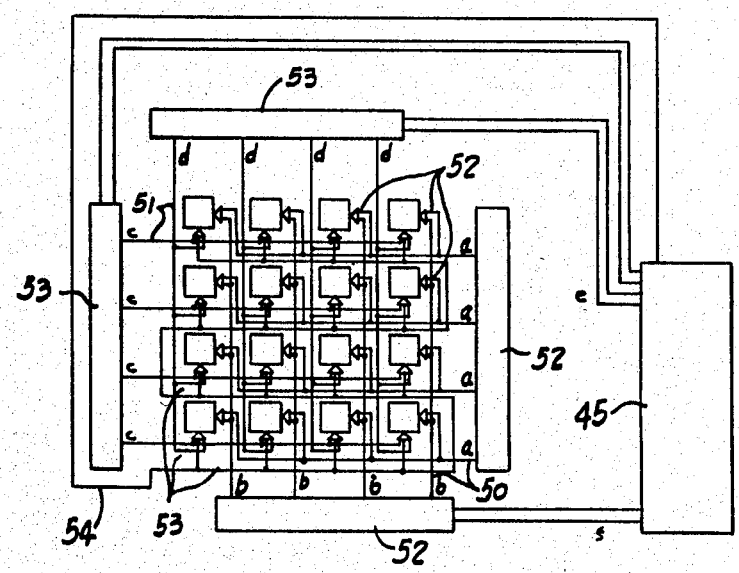

In the digital coded circuitry, FIG. 7, each individual pad on the matrix substrate 16 has two wires leading from it to the circuitry, one wire 46 leading to the digital address circuitry 47 and one wire leading to the digital read circuitry 49. The central processing circuitry 45 would control the digital address circuitry 47 and the digital read circuitry 49. An 8000 (acutally 8192) pad 17 matrix substrate 16 would have a 13 wire digital address and a 14 wire digital read between it and the central processing circuitry 45.

In the digital coded circuitry embodiment the matrix substrate 16, the digital address circuitry 47 and the digital read circuitry 49 are preferably on the same printed circuit board. The wires 46 and 48 would be etched lines.

In the matrix coded circuitry, FIG. 8, each individual pad 17 on the matrix substrate 16 is addressed and read over matrix wires 50 and 51 leading from the matrix substrate 16 to the processing circuitry 45. The matrix address wires 50 consist of a multitude of x-y oriented wires a, b addressing the matrix of pads 17 through address "and" devices 52. When a voltage is present on a pair of wires a,b the pad 17 having x-y coordinates corresponding to that particular pair of wires a,b is energized, addressed. The matrix read wires 51 consist of a multitude of x-y oriented wires c,d selectively connecting the matrix of pads 17 through read "and" gates 53 to common buss 54. The voltage applied on the pairs of wires c,d selectively connects a pad 17 having x-y coordinates corresponding to that particular pair of wires c,d to the common buss 54. If that particular read pad 17 is energized, either directly by the address wires 50 or by a connection of that read pad 17 to the addressed pad 17 through the circuit board 23 being tested, there will be a voltage present on the common buss 54; an interconnection would be indicated. If that particular read pad 17 is not energized there will be no voltage present on the common buss 54; a non-interconnection would be indicated.

The matrix address circuitry 52 and matrix read circuitry 53 are preferably directly mounted on the back of the matrix substrate in the form of flat pack chips. See FIG. 9. Each chip would address and/or read a portion of the matrix substrate 16.

Readily available 64 gate muti-gate "and" flat pack chips 55 present a good compromise between reliability and efficiency of interconnections. Each multi-gate chip 55 would address and/or read a section of pads 17 of the matrix substrate 16. Small wires (not shown for clarity) would run from each multi-gate chip 55 to the series of pads 17 that particular chip 55 is to service.

Each multi-gate chip 55 is connected to parallel address wires f or parallel read wires e along with common buss 54.

The parallel address e and read wires f are sufficient in number to cause the multi-gate chip 55 to scan the full number of pads 17 that chip is to service. Six parallel wires would scan 64 points (not including a ground).

Each individual chip 55 is in addition connected to an enabling line 56. The enabling lines 56 are run from an enabling chip 57 to each multi-gate chip 55. The enabling chip 57 selectively enables a particular multi-gate chip 55 to cause that particular chip to scan the series of pads 17 that particular chip services as the chip is instructed to do by the parallel address or read wires.

Figure 9:
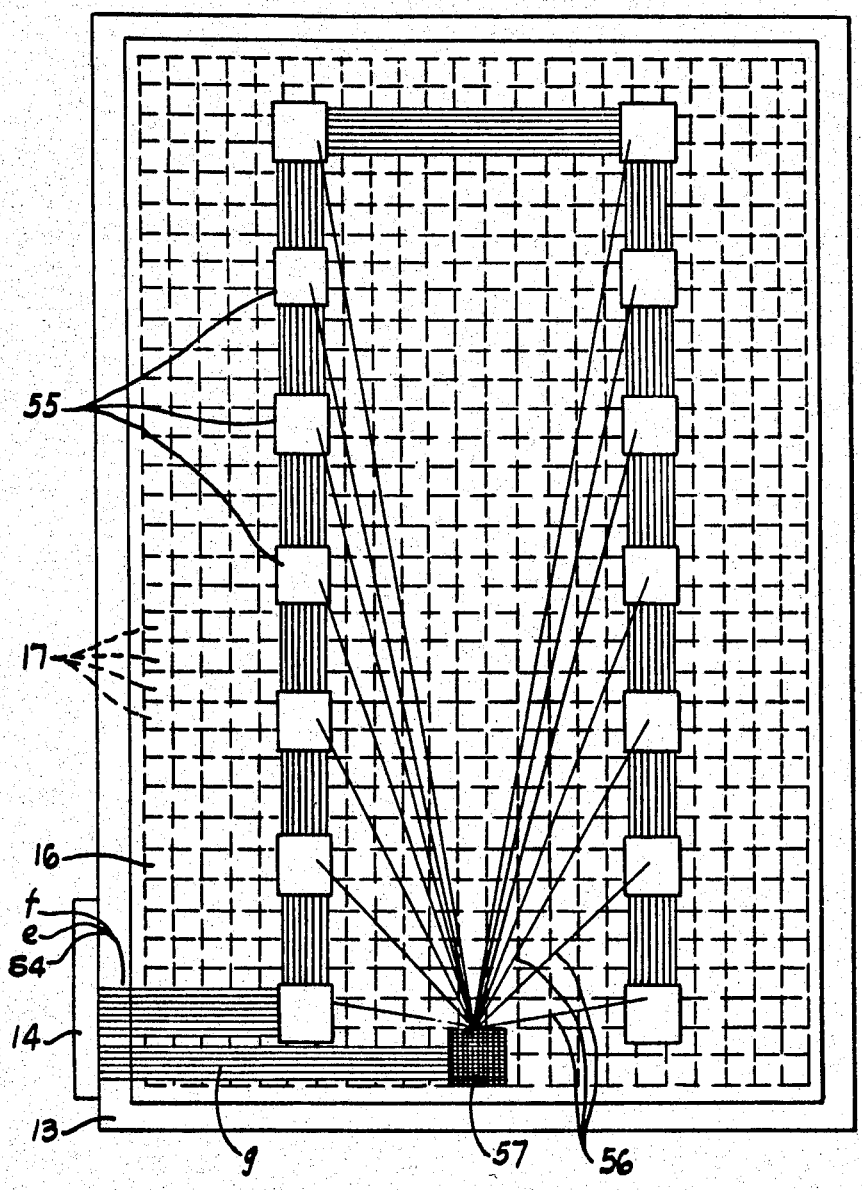
FIG. 9 is a bottom view of a matrix testing jig with associated multi-gate address chips.
Figure 10A:
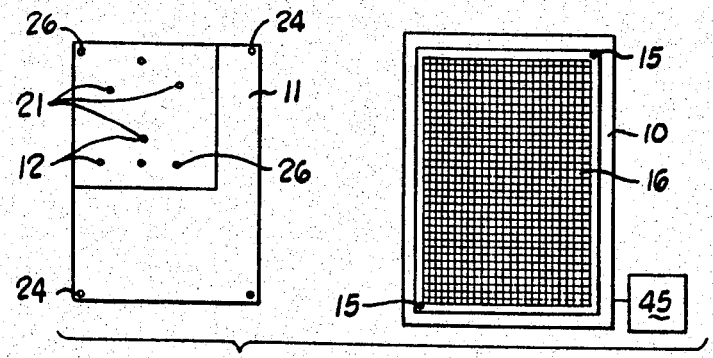
FIGS. 10a–10d show a sequence of top-view drawings generally disclosing the method for testing circuit boards of this invention.
Figure 10B:
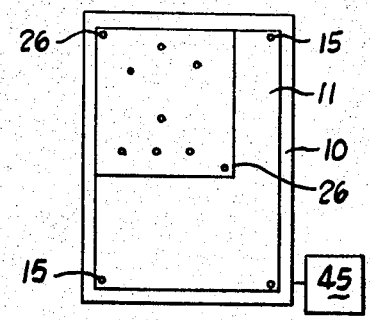
Figure 10C:
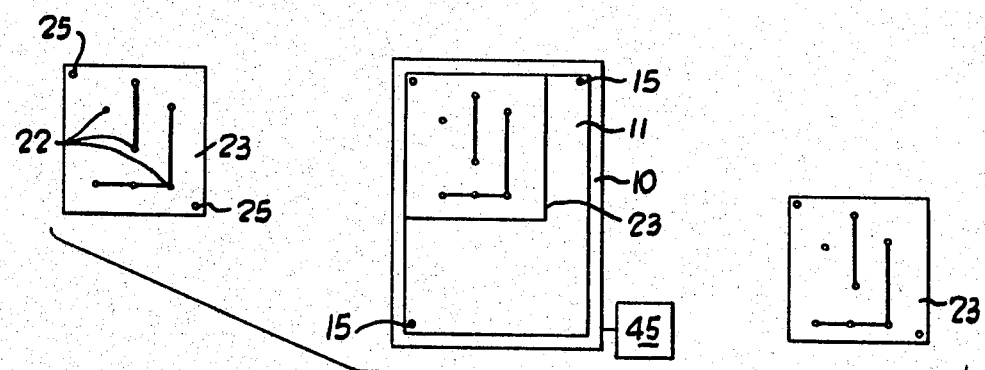
Figure 10D:
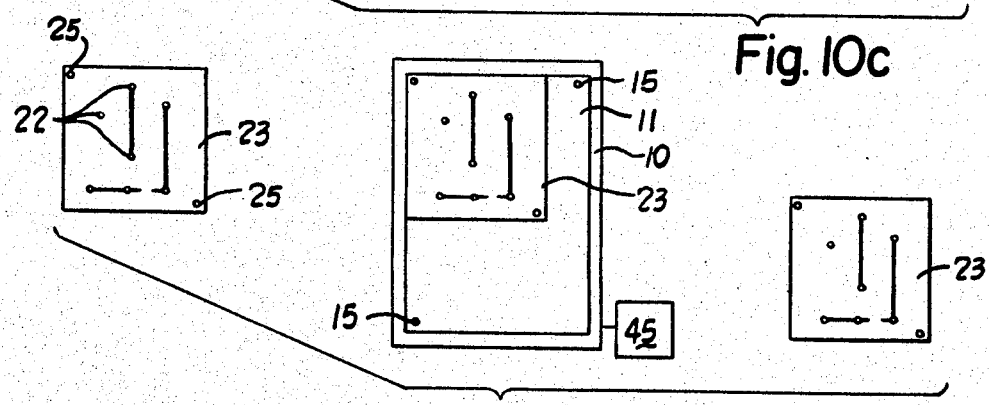

The enabling chip 57 is itself a multi-gate "and" chip. Four wires g would enable 16 multi-gate chips 55 (FIG. 9 has 14). (Not including a ground.)

In this way any chosen pad 17 on the matrix substrate can be selectively addressed or read.

A 16,000 pad 17 matrix substrate could be addressed or read with two hundred and fifty 64 gate multi-gate chips 55, 4 first level 64 gate enabling chips 57 and 1 super level 4 gate enabling chip (not shown - for enabling the enabling chips.) (14 wires total not including ground or common buss 54.)

More advanced integrated circuitry will have complex access pads on at least one side. Most of these pads are physically unaccessible. A way is needed to reliably interconnect these pads with the outside world without compromising either the chip or the virtues of replaceability, speedy connections, ease of manufacture, ease of maintenance, et. al. The solution to this problem is found in FIGS. 15-19.

The chip 80 has 100 small pads 81 on one flat side (it's bottom) 82 and 9 small pads (not shown) on each of two opposing side walls 83. See FIG. 15. The 100 small pads 81 are for interconnection with the pads 17 of the matrix substrate 16. The 18 small pads are for serial interfacing with other components.

The chip 80 is physically held in place by four plastic snap-in mounting brackets 84. These brackets 84 allow for the easy insertion and removal of the chip 80. Once in place the chip 80 is reliably held in place. Two of the brackets 84 each have 9 small leaf contacts 85 for contact with the small interface pads on the sidewalls 83 of the chip 80.

When the chip 80 is in place the small pads 81 on the bottom 82 of the chip 80 are physically located in contact with another set of small pads 86 on the matrix substrate 16. Both pads 81 and pads 86 have small holes, 87 and 88 respectively, in their centers. The holes 87 and 88 can be in alignment (as shown) on slightly offset. It is preferable that at least part of the holes 87 and 88 communicate with each other (i.e. join at their common surface). A small amount of mercury, ferro-fluid, or other wetable liquid 89 is trapped within these holes 87, 88. This liquid insures that there will be reliable electrical contact between the pads 87, 88. Variations in pad separation are automatically compensated for. Time, little shifts of location, handling, corrosion (of the pads) et. al. will not effect the interconnection.

The set of pads 86 on the matrix substrate 16 are connected to the pads 17 through the substrate 16. (The substrate 16 is of multi-layer construction). There are no wires between the chip 80 and the pads 17.

To connect the chip 80 to the substrate 16, the substrate 16 is located with the pads 86 facing upwards. One places small amounts of the wetable fluid 89 in the then upfacing holes 88 in the pads 86 (see top half of FIG. 18). The amount of this fluid 89 is chosen to be a little more than is necessary to fill both holes 87 and 88. This insures that the holes 87 and 88 will be filled. It also means that a little of the fluid 89 will be trapped between the flat surfaces 90, 91 of the pads 81, 86. This provides further electrical contact between pads 81, 86. The roughness of the bottom of holes 87 and 88 improves the electrical contact between the pads and the fluid 89. When fluid 89 has been placed in all of the holes 88 the chip 80 is inserted into place. This physical movement captures the fluid 89 in the holes 87, 88 in the pads 81, 86. This physical movement also causes the leaf contacts 85 to contact the interface pads on the sidewalls 83 of the chip 80. The other chips 80 would be similarly connected. No soldering is necessary (or desired). Once connected there will be reliable electrical interconnection between the pads 81, 86 until the chip 80 is intentionally removed.

Again in order to speed up the testing cycle the central processing circuitry 45 in any of these circuitry embodiments would preferably be programmed with the coordinates of the active pads of matrix substrate 16 for a given circuit board 23 being tested and instructed to examine only those active coordinates for interconnections and opens.

The method of our invention is based upon the matrix testing jig 10 (FIG. 10). The method includes the steps of preparing a pin board 11 step 10a, incorporating the pin board 11 into the matrix testing jig 10 to form the testing apparatus 10b, programming the testing machine 10c and testing circuit boards of unknown quality with the testing apparatus and machine 10d.

The pin board 11 is a plain board, preferably an insulating board. It is sized to be equal to or greater than the pattern of points on the circuit board to be tested.

The pin board 11 is prepared by drilling holes having the pattern of points on the circuit board to be tested in it, inserting double ended electrically conductive pins 12 into these holes, and creating a way of locking the pin board 11 in respect to the matrix substrate 16 and a way of orienting the circuit boards 23 to be tested in respect to the pin board 11.

The holes drilled in the pin board 11 are preferably single sized, the double ended pins 12 preferably having top and bottom portions insuring good contact with the points on the circuit board to be tested and the pads 17 of the matrix substrate 16 respectively, the way of locking the pin board 11 in respect to the matrix substrate 16 preferably locating pins and holes in combination with a tight fit with the frame and vacuum holddown, and the way of orientating the circuit boards to be tested preferably the same way used during the manufacturing process to orient such boards.

After the pin board 11 is prepared, it is incorporated into the matrix testing jig 10 to form the testing apparatus.

The pin board 11 is located in position in respect to the matrix testing jig 10 and locked. The pin board 11 cannot move in respect to the matrix substrate 16. The bottom portion of each pin 12 is in contact with at least one pad 17. The top portion of each pin 12 is available to contact the point on the circuit boards to be tested that top portion is to test. Each pin 12 has a circuit including a pad 17 leading to the testing machine. The means of orienting the circuit boards to be tested is ready to orient such circuit boards. step 10b.

After the pin board 11 is incorporated into the matrix testing jig 10 to form the testing apparatus the testing machine is programmed. Programming is usually done by placing a known good circuit board upon the testing apparatus and instructing the testing machine to program itself with the point to point interconnections present on such good circuit board. step 10c.

The known good circuit board is known to be good because it has been previously examined.

Alternately the testing machine can be separately programmed, or the active pads manually connected to it.

After the testing machine has been programmed the known good circuit board is marked and set aside; in the event that a pin 12 changes position in respect to a pad 17 it may be necessary to recheck the alignment of the testing apparatus and/or reprogram the testing machine.

After the testing machine has been programmed the unknown quality circuit boards are placed upon the testing apparatus in sequence and tested. Step 10d. The testing machine compares the unknown quality circuit board pad 17 interconnections with those of the known good circuit board. If the testing apparatus is connected to a current testing machine with a discrete circuit from every pad 17 to the testing machine all points are examined. If the testing apparatus has the circuitry of this application only the active point to point interconnections are examined. In any event if the readings known good circuit board-unknown quality circuit board are identical that particular unknown quality circuit board is good. If the readings are divergent that particular unknown quality circuit board is bad.

It is possible that sometime during the testing of a sequence of unknown quality circuit boards a number of such boards will be "bad" for similar reasons. This could mean that a pin 12 has changed its point contact in respect to a particular pad. To test this the known good circuit board is again placed upon the testing apparatus and again checked. If the known good circuit board now reads "bad" a pin 12 or series of pins 12 probably did change positions of contact in respect to a pad 17 or a series of pads 17. If so, the testing machine is reprogrammed with the new readings of the known good circuit board. If the known good circuit board reads good, however, the unknown quality circuit boards are probably bad.

Alternately the testing machine can be reprogrammed with the readings of the known good circuit board any time the readings of the unknown quality circuit boards are in doubt.

The apparatus and method of this application are disclosed in relationship to bare and assembled printed circuit boards and as examining the point to point interconnections on such boards with active circuitry. They are, however, capable of testing other structures and with other circuitry. In regards to the structure, for example, an assembled circuit board could be connected to operating voltages and loads with the matrix coded circuitry read 'and' gates (53 of FIG. 8) examining selected points on the active assembled and operating circuit board for voltages, resistance and/or current present at each of these points. The apparatus would troubleshoot a loaded operative board. Please note that the matrix address 'and' gates (52 of FIG. 8) would not be needed for such examination, although leads to properly connect the board to operating voltages and loads would be. Any device having a relatively planar orientation of electrically interconnected points, or able to be converted to such, can be examined by this apparatus and method. In regards to the circuitry, for example, passive circuitry (usually diode biased) similar to that used for key board scanning could be used to determine the shorts and opens present between pads 17; the shorts between pads 17 would be read out as voltages or currents present on various combinations of readout lines for a given line input—the circuit board being tested being the functional equivalent of multiple switch closings between pads 17. The presence or absence of a combination of shorts would be compared with the particular combination of shorts present on the known good board. Any difference equates to a tested board being bad. Due to the possibly random orientation of these shorts and the problem of false positives (a short indicated where there is none), it would be preferable in this passive circuitry example to scan as many axes as possible (x,y, diagonal z and diagonal a) while reading the output of as many of the other axes as possible (respectively) to obtain a multiple plotting of the co-ordinates of the shorted pads (instead of the more normal scan x read y). This is especially important if shorts and opens must be ascertained between pads 17 having a close proximity to each other. Any error induced by the passive circuitry would be accepted as concomitant with the reduced cost of passive circuitry. The scanning of x while reading y,z and a presents a good compromise between accuracy and the complexity of determining the co-ordinates of the shorted pads.

Although this invention has been described in its preferred form with a certain degree of particularity, it is to be understood that numerous changes in the details of construction and mode of operation can be made without departing from the scope of the invention as hereinafter claimed.

We claim:

1. In an electrical device having a number of contacts for use with a different number of spaced pads, the improvement comprising means to move one of the number of contacts or the different number of spaced pads in planar relation to the other of the number of contacts or the different number of spaced pads, such movement allowing one to substantially optimally align the number of contacts with the different number of spaced pads.

2. In an electrical device having a number of contacts for use with a different number of spaced pads, the contacts preferably not being aligned with the spaces between the pads, the improvement comprising means to hold the contacts and the pads to allow for two direction planar movement therebetween, means to move one of the contacts or the pads in one planar direction relation to the other of the contacts or the pads and means to move one of the contacts or the pads in the second planar direction in relation to the other of the contacts or the pads, the two direction planar movement between the contacts and the pads allowing one to substantially optimally align as many as practical of the contacts with the pads and as few of the contacts with the spaces between the pads.

3. The improved electrical device of claim 2 characterized in that the two directions of planar movement have co-ordinates readouts for accurate and repeatable adjustment.

4. In an electrical testing device having a number of pins for use with a different density number of spaced pads, the pins preferably not being in alignment with the spaces between the pads, the improvement comprising means to hold the pins and the pads so as to allow planar movement in X and Y axis therebetween, means to move one of the pins or pads in such plane in the X axis, means to readout the X axis coordinates, and means to move one of the pins or pads in such plane in the Y axis, means to readout the Y axis coordinates, the X and Y axis planar movement between the pins and the pads allowing one to substantially optimally align as many as practical of the pins with the pads and as few of the pins with the spaces between the pads and the co-ordinate readouts allowing for accurate and repeatable alignment.

5. The improved electrical testing device of claim 4 characterized in that the X and Y axis co-ordinate readouts are determined and set from a comparison of the co-ordinates of the pins with the co-ordinates of the pads.

6. The improved electrical testing device of claim 4 characterized by the addition of the pins and pads can also move in a rotary Z planar axis therebetween, means to move one of the pins or pads in such plane in the Z axis and means to readout the Z axis coordinates, the addition of the rotary Z axis allowing for more precise alignment of the pins with the pads.

7. A method for substantially optimally aligning a number of contacts with a different number of spaced pads, the contacts and pads both having co-ordinates, the method comprising comparison of the co-ordinates of the contacts with the co-ordinates of the pads to determine the adjustment factors necessary to substantially optimally align the contacts with the pads and then adjusting the relative positions between the contacts and the pads in accord with the adjustment factors.

8. The method of claim 7 wherein the pads are connected to a testing machine for determining the electrical interconnection between such pads and characterized in that the comparison of the co-ordinates of the contacts with the co-ordinates of the pads utilizes the testing machine.

9. The method of claim 7 characterized in that the comparison of the co-ordinates of the contacts with the co-ordinates of the pads utilizes a computer.

10. The method of claim 7 characterized in that the comparison of the co-ordinates of the contacts with the co-ordinates of the pads utilizes a separate alignment template replicating the co-ordinates of the gaps and pads.

11. A method for suhstantially optimally aligning a number of non electrically interconnected pins on a pin board with a different density number of spaced pads on a matrix substrate, the pads connected to a circuit board testing machine for testing electrical interconnections between the pads, the method comprising locating the pins on the pin board in respect to the pads on the matrix substrate, testing such pin board, and then moving the pin board in respect to the matrix substrate to minimize any electrical interconnections between the pads, this movement also substantially optimally aligning the number of pins with the different density number of spaced pads.

12. A method for substantially optimally aligning a number of pins on a pin board with a different density number of spaced pads on a matrix substrate, the pins and pads both having co-ordinates, the method comprising of feeding information on the available axis of adjustments between the pins and pads into the computer, feeding the co-ordinates of the pins and the co-ordinates of the pads into the computer, asking the computer to compare such co-ordinates to determine the adjustment factors necessary to substantially optimally align the co-ordinates of the pins with the coordinates of the pads within the confines of the possible axis of adjustments therebetween and then aligning the pins with the pads in accord with the adjustment factors output by the computer.

13. A method for substantially optimally aligning a number of pins through holes in a pin board with a different density number of spaced pads on a matrix substrate, the pads being laid out in a pattern with gaps therebetween, the method comprising locating an unpinned pin board on an alignment template having a matrix of light areas replicating the pattern of the gaps between the pads, moving the pin board and alignment template in respect to each other within the confines of the available axis of adjustment between the pin board and the matrix substrate to minimize the ammount of light coming through the holes in the pin board, this movement substantially replicating the optimal alignment between the number of pins with the different density number of spaced pads, and then aligning the pinned pin board with the matrix substrate in accord with the adjustment factors determined by use of the alignment template, this action optimally aligning the number of pins with the different density number of spaced pads.

14. In a device utilizing a matrix address integrated circuit chip to scan a series of pads for electrical interconnections therebetween, the improvement of the addition of at least one other matrix address integrated circuit chip and an enabling means, said enabling means selectively enabling the martix address integrated circuit chip or said additional matrix address integrated circuit chip, the selective enabling allowing a significant increase in the number of pads able to be scanned by the device.

15. The improved device of claim 14 characterized in that said additional matrix address integrated circuit is connected substantially parallel to the matrix address integrated circuit chip.

16. The improved device of claim 14 characterized in that said enabling means is an integrated circuit chip.

17. A means to reliably releasably electrically interconnect a pair of two adjoining electrically conductive pads, said means comprising a hole, said hole being in one of the two adjoining pads, said hole having an opening, said opening of said hole facing the other of the two pads, said hole having a volume, electrically conductive fluid, said electrically conductive fluid having a volume, said volume of said fluid being substantially a little more than said volume of said hole, and said fluid being substantially in said hole, said fluid reliably releasably electrically interconnecting the two adjoining pads.

18. The means of claim 17 characterized in that said hole has a bottom opposite said opening of said hole and said bottom of said hole being rough, the roughness of said bottom improving the electrical conductivity between the pad with said hole and said electrically conductive fluid.

19. The means of claim 17 characterized in that the pair of two pads is inaccessible to ordinary electrical connection means.

20. The means of claim 17 characterized in that the pair of two pads join at a plane and in that other pairs of two pads similarly joined also exist at said plane.

21. A means to reliably releasably electrically interconnect a pair of two adjoining electrically conductive pads, said means comprising a hole, said hole being in one of the two adjoining pads, said hole having an opening, a second hole, said second hole being in the other of the two adjoining pads, said second hole having an opening, said opening of said hole substantially facing said opening of said second hole, said hole and said second hole, said holes, having a combined volume, electrically conductive fluid, said electrically conductive fluid having a volume, said volume of said fluid being substantially a little more than said combined volume of said holes, and said fluid being substantially in said holes, said fluid reliably releasably electrically interconnecting the two adjoining pads.

22. The means of claim 21 characterized in that said holes each have a bottom opposite their respective openings and said bottoms of said holes being rough, the roughness of said bottoms improving the electrical conductivity between the pads with said holes and said electrically conductive fluid.

23. The means of claim 21 characterized in that the pair of two pads join at a plane and in that other pairs of two pads similarly joined also exist and are in the said same plane.

24. A method for electrically connecting two electrically conductive pads, the method comprising locating an electrically conductive fluid in a hole in one of the two pads, said hole retaining said fluid in position, and moving the pads together, the movement trapping said fluid in said hole and in contact with both of the two pads.

25. The method of claim 24 wherein said fluid has a volume and said hole has a volume and wherein said volume of said fluid is a little more than said volume of said hole.

26. A method for electrically connecting two electrically conductive pads, the method comprising locating an electrically conductive fluid in a hole in one of the two pads, said hole retaining said fluid in position, positioning the other of the two pads over the first of the two pads, the other of the two pads having a hole, and moving the pads together with said holes in the pads being in substantial alignment, the movement trapping said fluid in said holes and in contact with both of the two pads.

27. The method of claim 26 wherein said fluid has a volume and said holes have a combined volume and wherein said volume of said fluid is a little more than said combined volume of said holes.

* * * * *